US005841376A

United States Patent [19]
Hayashi

[11] Patent Number: 5,841,376
[45] Date of Patent: Nov. 24, 1998

[54] DATA COMPRESSION AND DECOMPRESSION SCHEME USING A SEARCH TREE IN WHICH EACH ENTRY IS STORED WITH AN INFINITE-LENGTH CHARACTER STRING

[75] Inventor: Takaaki Hayashi, Yokohama, Japan

[73] Assignee: Kyocera Corporation, Kyoto, Japan

[21] Appl. No.: 646,516

[22] Filed: May 8, 1996

[30] Foreign Application Priority Data

Sep. 29, 1995 [JP] Japan .................................. 7-253433
Apr. 25, 1996 [JP] Japan .................................. 8-105506

[51] Int. Cl.$^6$ .................................................. H03M 7/30
[52] U.S. Cl. ............................................ 341/51; 341/50
[58] Field of Search .................................. 341/50, 51, 87

[56] References Cited

U.S. PATENT DOCUMENTS

| | | |
|---|---|---|
| 4,464,650 | 8/1984 | Eastman et al. . |
| 4,558,302 | 12/1985 | Welch . |
| 4,701,745 | 10/1987 | Waterworth . |
| 4,814,746 | 3/1989 | Miller et al. ............................. 341/95 |
| 4,876,541 | 10/1989 | Storer ...................................... 341/51 |
| 4,906,991 | 3/1990 | Fiala et al. .............................. 341/51 |
| 5,003,307 | 3/1991 | Whiting et al. .......................... 341/51 |
| 5,016,009 | 5/1991 | Whiting et al. .......................... 341/67 |
| 5,049,881 | 9/1991 | Gibson et al. ........................... 341/95 |
| 5,115,484 | 5/1992 | Johnson ................................... 385/72 |
| 5,126,739 | 6/1992 | Whiting et al. ........................ 341/106 |
| 5,146,221 | 9/1992 | Whiting et al. .......................... 341/67 |
| 5,150,119 | 9/1992 | Yoshida et al. .......................... 341/51 |
| 5,239,298 | 8/1993 | Wei ......................................... 341/51 |
| 5,254,990 | 10/1993 | Yoshida et al. .......................... 341/51 |
| 5,406,281 | 4/1995 | Klayman ................................. 341/51 |

OTHER PUBLICATIONS

J. Ziv, et al., "A Universal Algorithm for Sequential Data Compression" IEEE Transactions on Information Theory, vol. IT–23, No. 3, pp. 337–343, 1977.
J. Ziv, et al., "Compression of Individual Sequences via Variable–Rate Coding", vol. IT–24, No. 5, pp. 530–536, 1978.
T. C. Bell., et al., "Better OPM/L Text Compression", IEEE Transations on Communications, vol. COM–34, No. 12, pp. 1176–1182, 1986.

Primary Examiner—Marc S. Hoff
Attorney, Agent, or Firm—Loeb & Loeb LLP

[57] ABSTRACT

A dictionary has a plurality of entries each for storing a pointer that indicates the head of a character string of input data stored in a data memory. A longest-coincidence character string that coincides with a character string to be coded over a longest length (i.e., a longest-coincidence length) is searched for from among the character strings indicated by the respective pointers. The longest-coincidence length and an index of an entry storing a pointer indicating the head of the longest-coincidence character string are coded, and a resulting code is written to a code memory. An entry storing the pointer indicating the head of the coded character string is added to the dictionary, to update it.

7 Claims, 12 Drawing Sheets

| ID | CHARACTER STRING |
|----|------------------|
| 0  | a                |
| 1  | b                |
| 2  | c                |
| 3  | a b a b c ···    |
| 4  | b a b c a ···    |
| 5  | a b c a b ···    |
| 6  | c a b a b ···    |
| 7  | a b a b a ···    |

| ID | ptr |
|----|-----|
| 3 | 0 |
| 4 | 1 |
| 5 | 2 |
| 6 | 4 |
| 7 | 5 |

FIG. 7B

| ID | ptr | off |
|----|-----|-----|
| 3 | 0 | 1 |
| 4 | 1 | 1 |
| 5 | 2 | 2 |
| 6 | 4 | 1 |
| 7 | 5 | 4 |

DATA COMPRESSION AND DECOMPRESSION SCHEME USING A SEARCH TREE IN WHICH EACH ENTRY IS STORED WITH AN INFINITE-LENGTH CHARACTER STRING

BACKGROUND OF THE INVENTION

1. Field of the Invention

The present invention relates to a data compression and decompression scheme which enables various kinds of data to be compressed and decompressed with no loss of information by universal coding. In particular, the invention realizes a high-speed, low-computation-cost data compression and decompression scheme that is suitable for data, such as binary image data, in which repeated occurrences of the same data pattern are remarkable.

2. Description of the Related Art

In recent years, with improvement of the CPU performance, data compression techniques have come to be used to compress and store into an external storage medium a text file or an object file that is handled by a computer. Compression schemes for that purpose should be able to properly compress various kinds of data whose statistical characteristics are unknown. Therefore, it is prerequisite that compression schemes under discussion be independent of statistical characteristics of data, that is, be what is called universal coding. The Lempel-Ziv (LZ) coding scheme is known as a typical universal coding scheme.

The Lempel-Ziv scheme is a data compression and decompression algorithm based on a dictionary. In this scheme, the term "character" means each word unit of input data as a compression object, and "character string" means a series of an arbitrary number of characters. In the LZ coding scheme, data compression is performed such that a history of already coded data is registered in a dictionary, the dictionary is searched for a character string that coincides with data being coded over the longest length among character strings registered therein, and a character string thus found is replaced by a code shorter than the former. Data decompression is performed such that a particular character string is uniquely designated based on a compressed code from among character strings registered in a dictionary that has been generated by a procedure similar to the above compression process, and is made restored data. A dictionary used in compression or decompression is constructed so as to be updated as a process proceeds and to be optimized for data being processed after a lapse of a sufficient time. Therefore, to implement the LZ coding scheme, the most important subject is how to construct a dictionary for storing a data history. Ziv and Lempel have already proposed the two basic concepts to construct a dictionary, which are called, according to the respective years of publication, the LZ77 scheme (see J. Ziv and A. Lempel, "A Universal Algorithm for Sequential Data Compression," IEEE Transactions on Information Theory, Vol. IT-23, No. 3, pp. 337–343, 1977) and the LZ78 scheme (see J. Ziv and A. Lempel, "Compression of Individual Sequences via Variable-Rate Coding," IEEE Transactions on Information Theory, Vol. IT-24, No. 5, pp. 530–536, 1978).

Figure 14A:
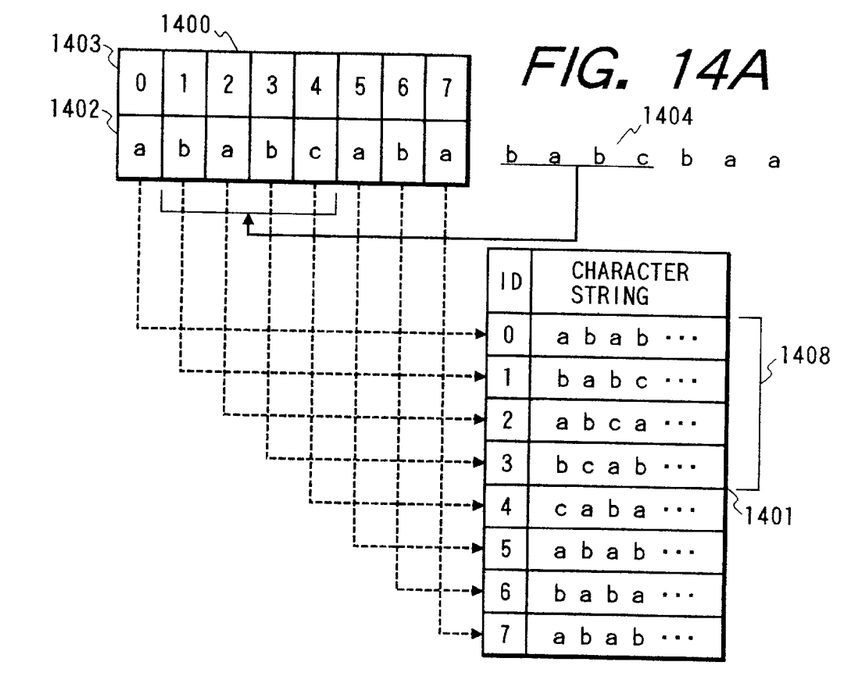
FIGS. 14A and 14B illustrate the LZ77 scheme.

In the LZ77 scheme, a reference buffer having a fixed, finite length is prepared and coded character strings are sequentially stored therein, whereby the reference buffer is used as a dictionary. For example, as shown in FIG. 14A, assume that there is a reference buffer 1400 having a memory size 8, and a coded data character string "ababcaba" is stored therein such that the characters is stored in respective registers 1402, which are assigned respective addresses 1403. It is also assumed that a data character string "babc" follows the above character string. In a representation of a character string, "a", "b" and "c" are characters that constitute data.

The concept of the simplest form of dictionary in the LZ coding scheme is expressed by an "index-character string" table. That is, a dictionary is constructed by indices representing entries and a set of entries to store respective character strings corresponding to the indices. The reference buffer 1400 is expressed by a dictionary 1401 in index-character string representation. An index of the dictionary 1402 is equivalent to a relative address value 1403 of the reference buffer 1400 counted from its head, and a character string of the dictionary 1402 is equivalent to a character string of the reference buffer 1400 starting from the character indicated by the associated address. One important feature of the LZ77 scheme is that a character string registered in each entry logically has an infinite length. In the schemes disclosed in the papers by Ziv and Lempel and many of the various modified schemes subsequently proposed, a dictionary accommodates character strings of finite lengths. However, this is not an essential limitation of the LZ77 scheme, but merely a result of an attempt to simplify the processing.

The essential limitation of the LZ77 scheme is that the reference buffer 1400 has a fixed length for the following reason. In the LZ77 scheme, a longest-coincidence character string is searched for from among already coded data character strings. It is apparent that finiteness of a search range is a necessary condition for performing a search in limited time. The LZ77 scheme satisfies this condition by limiting the number of character strings for a search by using a fixed-length reference buffer.

Although the LZ77 scheme limits a search range by using a fixed-length reference buffer, it can search that range inclusively. As is apparent from the relationship between the reference buffer 1400 and the dictionary 1401, all the character strings contained in the reference buffer 1400 are registered in the dictionary 1401. Therefore, in the LZ77 scheme, an inclusive search is made of the character strings in the search range that is limited by the reference buffer 1400 are subjected. Thus, it can be said that the LZ77 scheme is a scheme in which a fixed search range is set by using a reference buffer and coincidence between character strings is checked inclusively in that range.

The LZ77 scheme operates in the following manner. By comparing an input data character string 1404 with the respective character strings registered in the dictionary 1401, it is found that a character string registered in the entry of index 1 coincides with the input data character string 1404 over the longest length. The longest-coincidence character string is "babc" and the coincidence length is 4. Since the length of a character string registered in the dictionary 1401 is undetermined, a character string is not determined only by designating an index value of the dictionary 1401. Therefore, not only the index value 1 but also the coincidence length 4 is coded to determine the longest-coincidence character string "babc", to thereby allow the character string to be uniquely restored on the decompression side.

Figure 14B:
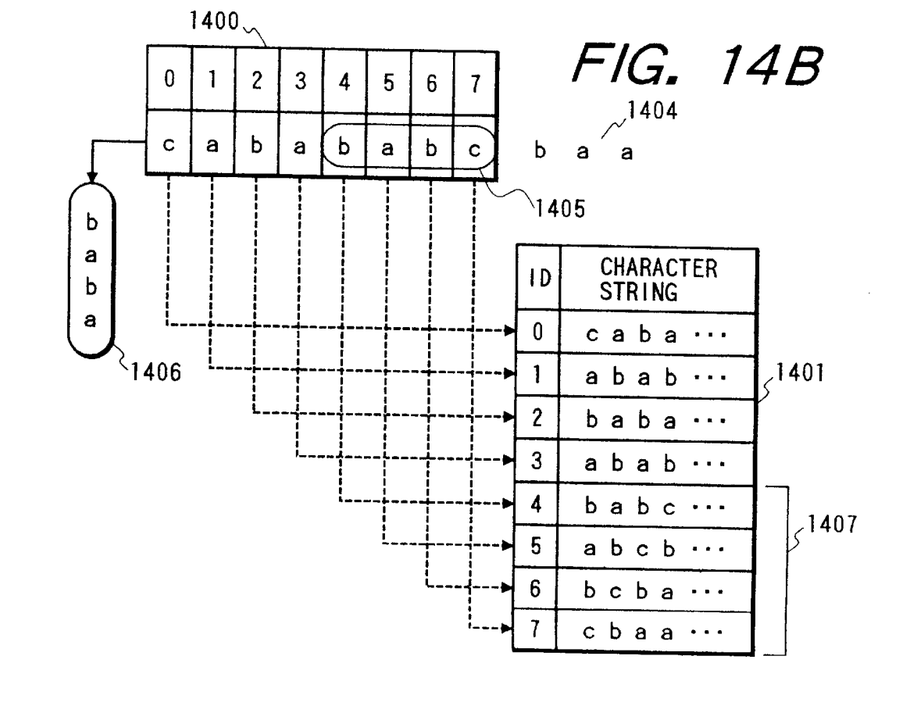

In the LZ scheme, a dictionary is updated at every coding. That is, to update the dictionary 1401, the character string just coded is inserted into the reference buffer 1400. Since the size of the reference buffer 1400 is fixed, the oldest characters in the reference buffer 1400 are discarded by the same number as the number of inserted characters. In the example of FIGS. 14A and 14B, the oldest character string "abab" (denoted by 1406) is removed from the reference buffer 1400 because the four characters have been coded. The four coded characters "babc" (denoted by 1405) are inserted into the reference buffer 1400. In this example, the insertion and discard are effected by shifting the character string by four characters as a whole. When attention is paid to the dictionary 1401, the four entries 1408 are removed and four entries 1407 are newly added, so that the total number 8 of entries is kept the same. The updating process of the LZ77 scheme has a feature that in the above manner a plurality of entries of a dictionary are updated at a time.

In practice, a dictionary of the LZ77 scheme is not constructed in the form of index-character string representation, but constructed such that search of a coincidence character string and updating of a dictionary can be performed more efficiently. For example, U.S. Pat. No. 4,701,745 entitled "Data Compression System" discloses a technique of searching for coincidence character string candidates in a reference buffer by using a Hash function. In a paper entitled "Better OPM/L Text Compression" (IEEE Transactions on Communications, Vol. COM-34, No. 12, pp. 1176–1182, 1986), a dictionary is constructed according to a binary tree algorithm. Further, U.S. Pat. No. 4,906,991 entitled "Textual Substitution Data Compression with Finite Length Search Tree" discloses a technique of constructing a dictionary by using a Patricia tree. All of these conventional techniques are intended to construct a dictionary of the LZ77 scheme efficiently, to thereby improve the compression ratio and speed up a search for a coincidence character string.

Figure 15A:
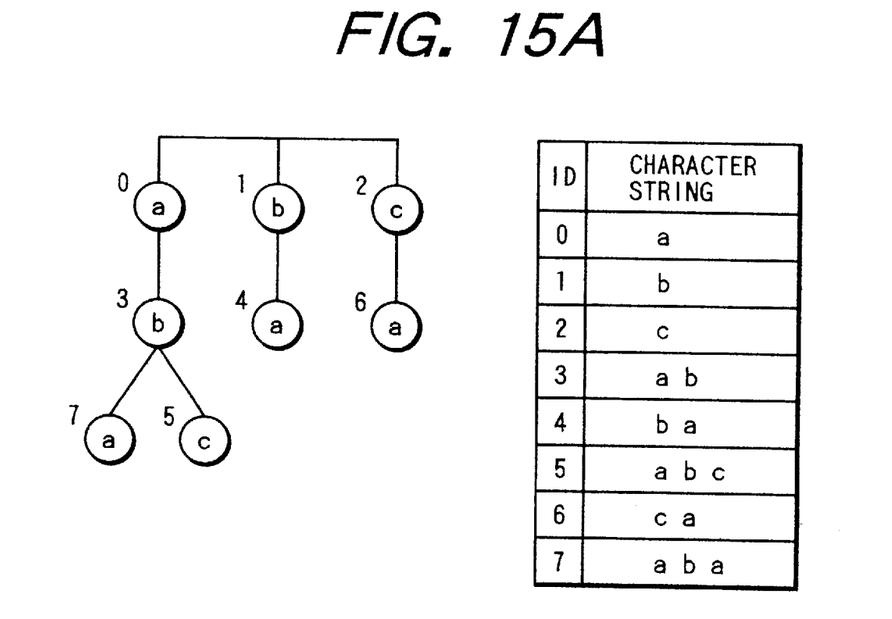
FIGS. 15A and 15B illustrate the LZ78 scheme.

On the other hand, in the LZ78 scheme, learning of a dictionary is conducted such that a search tree of the TRIE structure is used as the dictionary and coded data character strings are added to the search tree. The LZ78 scheme has been improved by Welch (U.S. Pat. No. 4,558,302 entitled "High Speed Data Compression and Decompression Apparatus and Method") and Miller and Wegman (U.S. Pat. No. 4,814,746 entitled "Data compression Method"). The improved version is called "LZW scheme" and now used commonly. FIG. 15A shows a search tree and a dictionary in index-character string representation that are obtained when the first seven characters of an input data character string "ababcabababcb" have been processed by the most basic version of the LZW scheme. A node of the search tree is equivalent to an entry of the dictionary, and a number attached to the shoulder of each node indicates an index of the corresponding entry. A character string registered at each entry of the dictionary is equivalent to a connection of characters stored at respective nodes located on a path from the root of the search tree to the corresponding node.

The most important and essential feature of the LZW and LZ78 schemes is that each node of a search tree stores a single character, because all the schemes originating from the LZ scheme should be able to uniquely determine a character string by designating the corresponding node. This means that it is sufficient for the LZ78 scheme to code only indices of entries of a dictionary, which is advantageous over the LZ77 scheme that is required to code coincidence lengths as well as indices.

In the LZ78 scheme, a character string is uniquely determined only by designating its index. It is therefore apparent the LZ78 scheme has a limitation that character strings registered in a dictionary should have finite lengths. That is, a necessary condition for being the LZ scheme is that all the character strings registered in a dictionary have finite lengths.

Figure 15B:
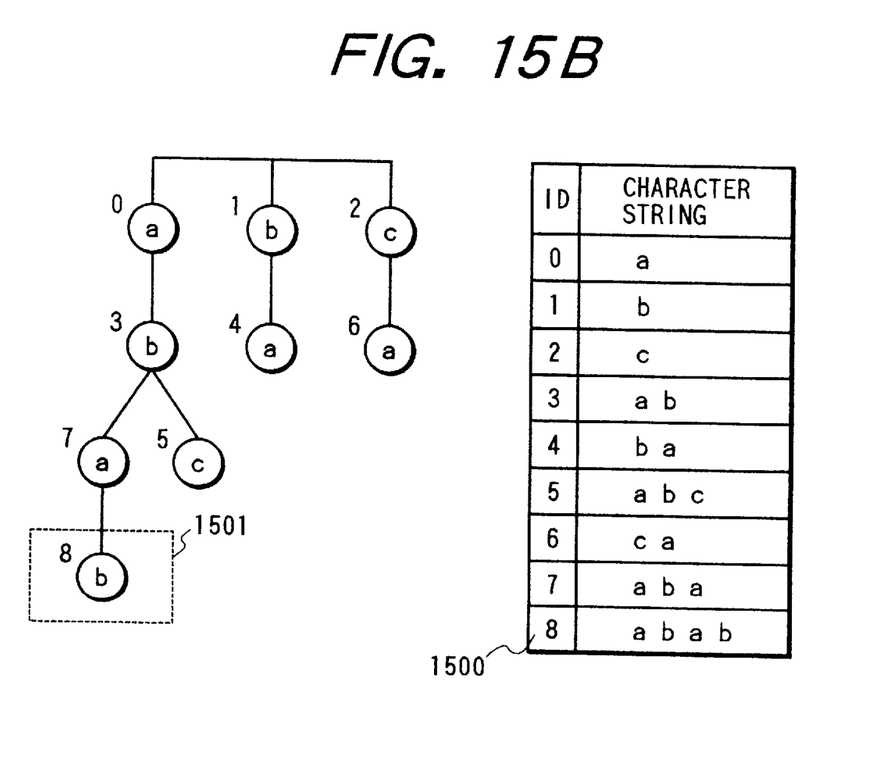

A description will be made of how an input data character string "ababcb" (i.e., the 8th and ensuing characters) are processed by using the dictionary of FIG. 15A. Since a character string that coincides with this input data character string over the longest length is a character string "aba" of index 7, an index value "7" is coded. The dictionary is updated by adding the new, 8th entry to it as shown in FIG. 15B. A character string "abab" (denoted by 1500), that is, the coded character string "aba" added with an input character "b", is registered in the new entry of the dictionary. At the same time as the dictionary updating, the search tree is changed such that a new node extends from the node of index 7 and character "b" is stored therein as indicated by reference numeral 1501. In this manner, in the dictionary updating of the LZ78 scheme, only one dictionary entry is added each time. In general, because of simpler dictionary updating, the LZ78 scheme can perform compression at higher speed than the LZ77 scheme.

As in the case of the LZ77 scheme, the search range should be limited in the LZ78 scheme. While the LZ77 scheme has the limitation of a fixed length reference buffer, in the LZ78 scheme the search range is limited by setting a maximum number of nodes of a search tree. When the number of nodes has reached the maximum number, a dictionary may be completely initialized (see U.S. Pat. No. 4,814,746 mentioned above), or one new node may be added with one old node discarded according to the LRU (least recently used) technique. Therefore, the referencing range of character strings is not fixed in the LZ78 scheme unlike the case of the LZ77 scheme.

Exhibiting superior compression performance with a simple configuration, the LZ77 and LZ78 schemes are widely used as universal coding. However, they encounter the following problems when it is needed to compress, at high speed, data having a vast data structure, such as binary image data, in which, for instance, the same data continues over several kilobytes (called "run") or data patterns having a strong correlation appear every several kilobytes.

First, in the LZ78 scheme, the limitation that character strings registered in a dictionary have finite lengths causes a problem particularly at the initial stage of a compression process. That is, at the initial stage of a compression process, when only short character strings are registered in a dictionary, a long run appearing in data cannot be compressed effectively. In addition to this run-related problem, compression schemes, such as the LZ78 scheme, having an essential limitation on lengths of character strings registered in a dictionary are very disadvantageous with respect to data in which the same data pattern of several hundred to several thousand bytes frequently appears.

Being free of any limitations on lengths of character strings registered in a dictionary, the LZ77 scheme can code a long data pattern at one time. However, the LZ77 scheme has a problem of a high processing cost, because in general the search for a longest-coincidence character string and the reference buffer updating are much more complex than those of the LZ78 scheme. Further, in the LZ77 scheme, since the processing volume increases in proportion to the size of a reference buffer, at present the maximum size of a reference buffer is as small as 1–2 Kbytes. Therefore, the LZ77 cannot properly accommodate data, such as halftone image data, which contains correlated data patters of several kilobytes.

SUMMARY OF THE INVENTION

The present invention has been made in view of the above problems in the art, and has an object of providing a data compression and decompression scheme which is simple in processing, and free of any limitations on lengths of character strings registered in a dictionary unlike the case of the LZ78 scheme.

Figure 1:
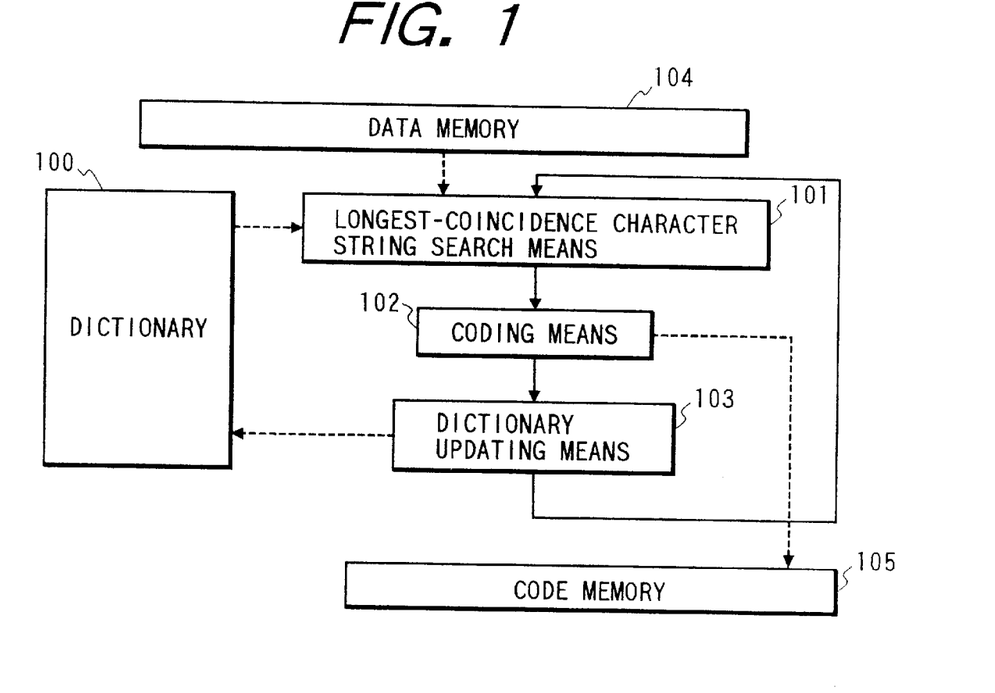
FIG. 1 shows the basic configuration of a data compression scheme according to the present invention.

FIG. 1 shows the basic configuration of a data compression scheme according to the invention. In this data compression scheme, input data stored in a data memory 104 is converted into compressed codes whose data amount is smaller than that of the input data, and the compressed codes are stored into a code memory 105. In FIG. 1, a solid-line arrow indicates a process flow and a broken-line arrow indicates a data movement.

The data compression scheme of the invention includes a dictionary 100 having a plurality of entries each for storing a first pointer that indicates a character string of the input data stored in the data memory 104, and means for performing three major processes.

The first means is a longest-coincidence character string search means 101 for searching for a longest-coincidence character string that coincides with a character string to be coded over a longest length from among the character strings indicated by the respective first pointers, the longest length being a longest-coincidence length.

The second means is a coding means 102 for coding the longest-coincidence length and an index of an entry storing a first pointer indicating the longest-coincidence character string, and for writing a resulting code to the code memory 105.

The third means is a dictionary updating means 103 for adding, to the dictionary 100, an entry storing the first pointer indicating the coded character string.

The dictionary 100 is expressed by a search tree that comprises a main node for storing a first pointer indicating a character string registered in the dictionary 100, and a branching node for representing branching in the search tree. Each of the entries of the dictionary 100 comprises the first pointer, the number of characters existing on a path from the root of the search tree to a branching position (this number is defined as an offset number), a second pointer for representing a link to a first-occurring branching node in the main node, and a third pointer for representing a link from a branching node to the next branching node.

Figure 2:
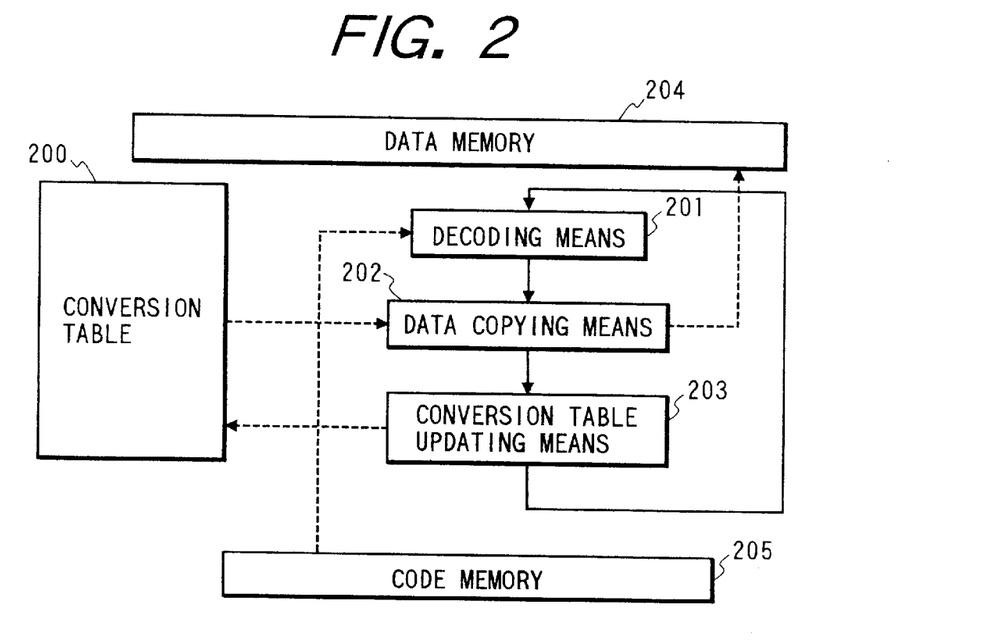
FIG. 2 is the basic configuration of a data decompression scheme according to the invention.

FIG. 2 shows the basic configuration of a data decompression scheme according to the invention. In this data decompression scheme, compressed codes stored in a code memory 205 is decompressed into original data, which are stored into a data memory 204. In FIG. 2, as in the case of FIG. 1, a solid-line arrow indicates a process flow and a broken-line arrow indicates a data movement.

The data decompression scheme of the invention includes a conversion table 200 having entries each for correlating an index value with a pointer indicating a restored character string stored in the data memory 204, and means for performing three major processes.

The first means is a decoding means 201 for determining an index corresponding to one entry of the dictionary 100 and a longest-coincidence length from a compressed code sent from the code memory 205.

The second means is a data copying means 202 for obtaining decompressed data by copying, to the data memory 204, a character string in the data memory 204 which is determined by the longest-coincidence length and a pointer obtained by giving the index to the conversion table 200.

The third means is a conversion table updating means 203 for updating the conversion table 200 by adding, to it, an indicating the character string in the data memory 204 which has been copied by the data copying means 202.

In the data compression scheme of the invention, each entry of the dictionary 100 stores a pointer to the data memory 104. This is logically equivalent to storing a character string of an infinite length. Therefore, a high compression ratio can be attained even if input data has a data structure in which a large data pattern of several hundred to several thousand bytes is repeated at high frequency. The dictionary updating means 103 can update the dictionary 100 simply by adding to it a new pointer to the data memory 104 indicating the head of a character string as coded by the coding means 102. That is, it is sufficient that only one entry be added to the dictionary 100 in each updating operation. This enables the compression process to be performed at high speed.

In the data decompression scheme of the invention, the conversion table 200 describes correspondence between indices of respective entries of the dictionary 100 and pointers to respective character strings in the data memory 204. Original data can be recovered simply in such a manner that the data copying means 202 copies character strings. Therefore, the decompression process can also be performed at high speed.

DESCRIPTION OF THE PREFERRED EMBODIMENTS

Configuration of Dictionary

Figure 3A:
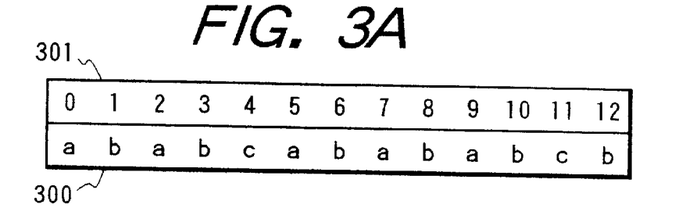
FIGS. 3A–3E show the configuration of a search tree.
Figure 3B:
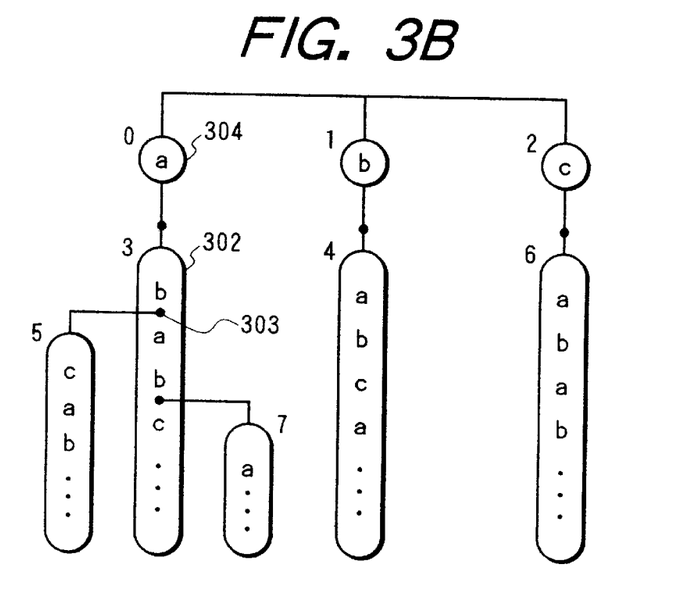

First, a description will be made of the configuration of a dictionary 100. As in the case of a dictionary used in the LZ78 scheme, the configuration of the dictionary 100 can conceptually be expressed by a tree. The most remarkable difference between the two kinds of dictionaries is that while the dictionary of the LZ78 scheme stores one character at each node (see FIGS. 15A and 15B), the dictionary 100 of the invention stores the value of a pointer of a character string, rather than the character string itself. FIG. 3A shows an input data character string 300, and FIG. 3B shows the concept of a search tree of the invention for the input data character string 300. The search tree includes main nodes 302, branching nodes 303, and initial registration nodes 304. Each main node logically stores a character string of an infinite length. A number attached to the shoulder of each main node 302 is the same as an index value of the corresponding entry of the dictionary 100. A branching node 303 indicates a branching point of the character string stored in the main node 302. Branching nodes 303 are necessarily generated when a main node 302 is newly generated so that they are associated with each other. All the characters that will appear in input data are preliminarily stored in the initial registration nodes 304. By virtue of the initial registration nodes 304, a character string that coincides with a subject character string over at least one character can necessarily be found. Therefore, the code format can be expressed as a set of an index and a coincidence length in a unified manner. A search tree may be so constructed as not to have any initial registration nodes. However, in such a case, it is not assured that a search for a longest coincidence character string succeeds. Therefore, it is necessary to prepare code formats for both cases where a coincidence character string is found and not found.

Figure 3C:
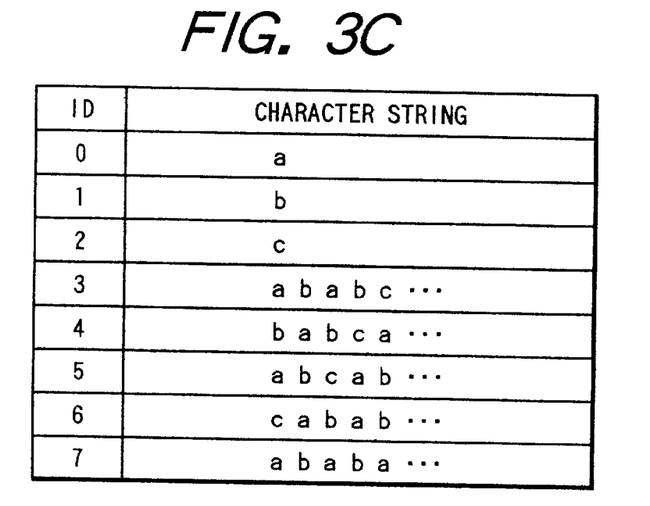
Figure 3D:
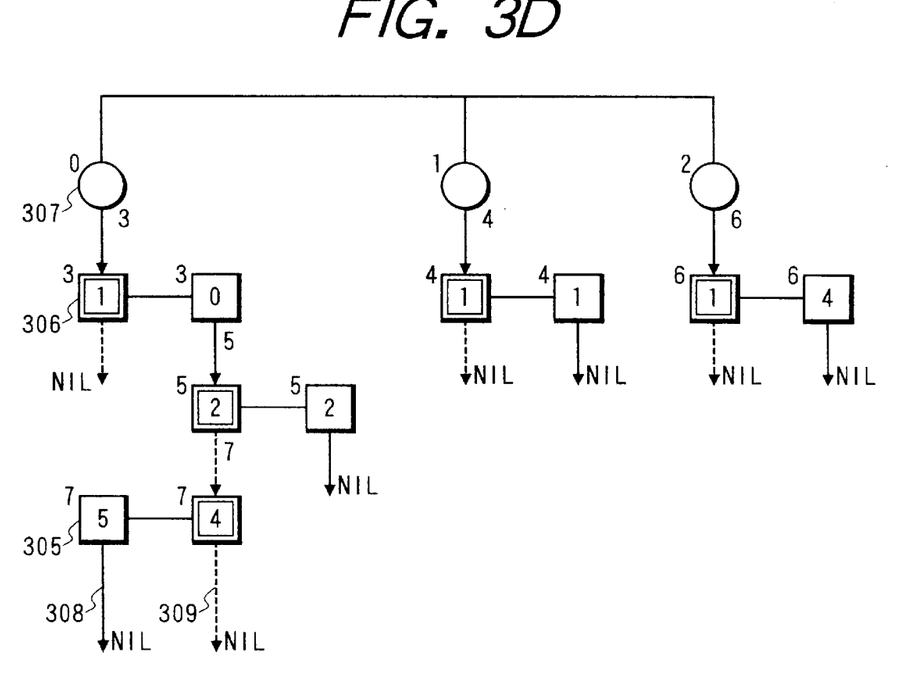

A character string stored in each main node 302 is obtained by tracing a path from the root of the search tree to the end of the main node 302 concerned. FIG. 3C shows a dictionary in index-character string representation equivalent to the search tree of FIG. 3B. As seen from FIG. 3C, in the dictionary 100 of the invention, every entry other than the initially registered characters stores a character string of a logically infinite length. It is physically impossible to store a character string of an infinite length. Therefore, instead of directly storing a character string in each main node 302, a pointer 301 to the input data character string 300 is stored therein. FIG. 3D shows the concept of a more realistic search tree, in which main nodes 305 are enclosed by squares, branching nodes 306 are doubly enclosed by squares, and initial registration nodes 307 are circled. A branch indicating a link from a main node 305 to a branching node 306 is expressed by a solid-line arrow 308, and a branch indicating a link from a branching node 306 to the next branching node 306 is expressed by a broken-line arrow 309. Each main node 305 stores the value of a pointer 301 of a character string rather than the character string itself. To indicate a branching point in the character string, each branching node 306 stores the number of characters counted from the root of the search tree to the branching point. "NIL" is a termination symbol indicating that there exists no branching nodes ahead.

Figure 3E:
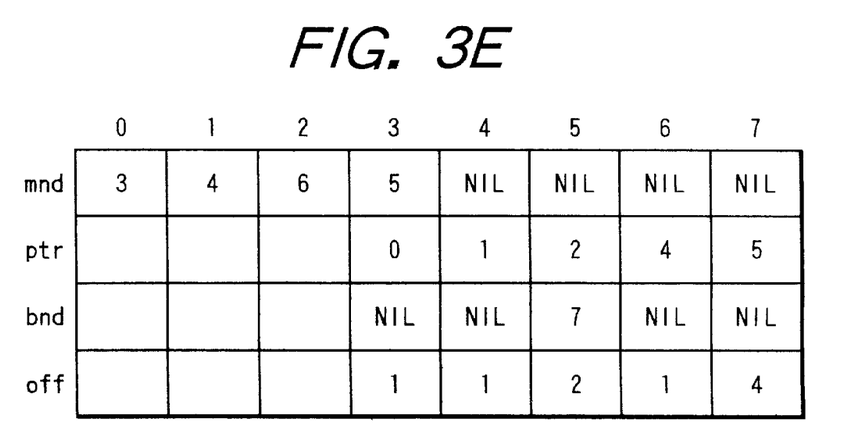

It is seen from FIG. 3D that the search tree of the invention is constructed by a set of four kinds of elements. Thus, in a physical memory, the dictionary is constructed by an array of entries that are expressed by four variables. FIG. 3E shows a dictionary in array representation. The four variables are defined as follows:

ptr: pointer to the input data character string 300 which pointer is stored in a main node 305;

off: offset number of a branching node 306;

mnd: branch from a main node 305 to a closest branching node 306; and bnd: branch from a branching node 306 to the next branching node 306.

The dictionary of the invention has been described above in terms of its conceptual configuration to its practical configuration to be developed in a physical memory. The dictionaries of FIGS. 3B–3E are essentially equivalent to each other though they are different in representation.

Now, a description will be made, by way of a specific example, of how a compression process of the invention is performed, with attention paid to growth of a search tree. An input data character string "ababcabababcbaa" is used as an example.

Figure 11A:
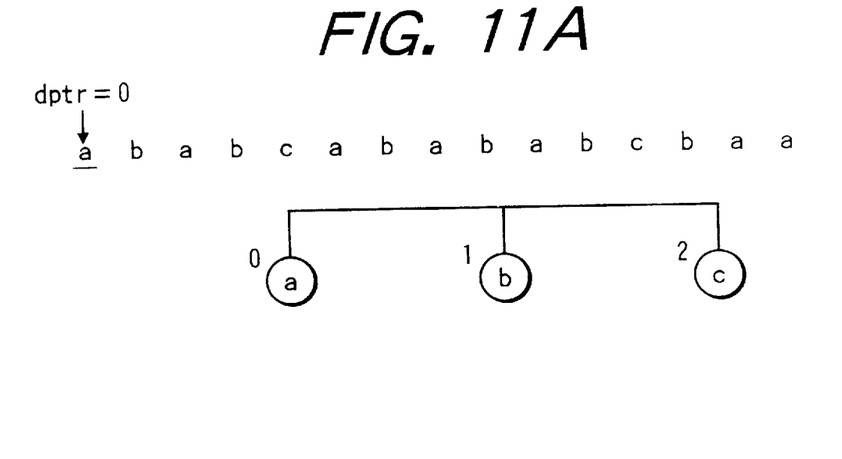
FIGS. 11A–11F illustrate how a search tree grows.
Figure 11B:
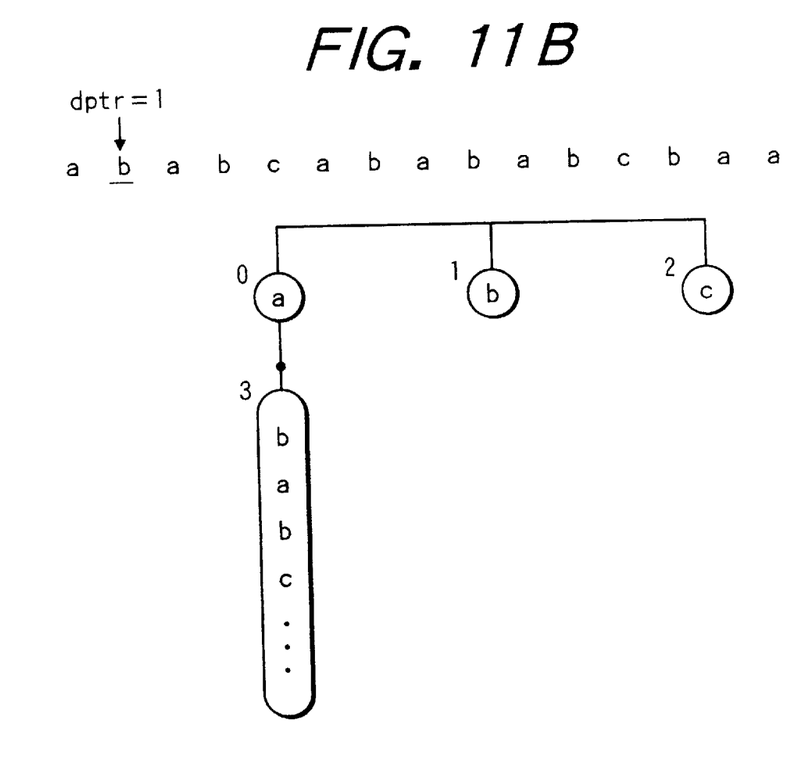

FIG. 11A shows a search tree in an initial state, which is constituted only of initial registration nodes. A data pointer is set at the head of the input data, and is given a value 0. A longest-coincidence character string for an input data character string starting from the head indicated by the data pointer value dptr=0 is "a" and its index is "0". The longest-coincidence character string has a coincidence length "1". Therefore, a set (0, 1) is coded. An entry of index 3 is added to the search tree, and its main node is stored with an infinite-length character string "ababc . . . " consisting of the coded character string "a" (character string starting from the character indicated by dptr=0) and the ensuing character string. The data pointer value dptr is incremented by the number 1 of coded character so as to have a value 1 (dptr=1). FIG. 11B shows a search tree in this state.

Figure 11C:
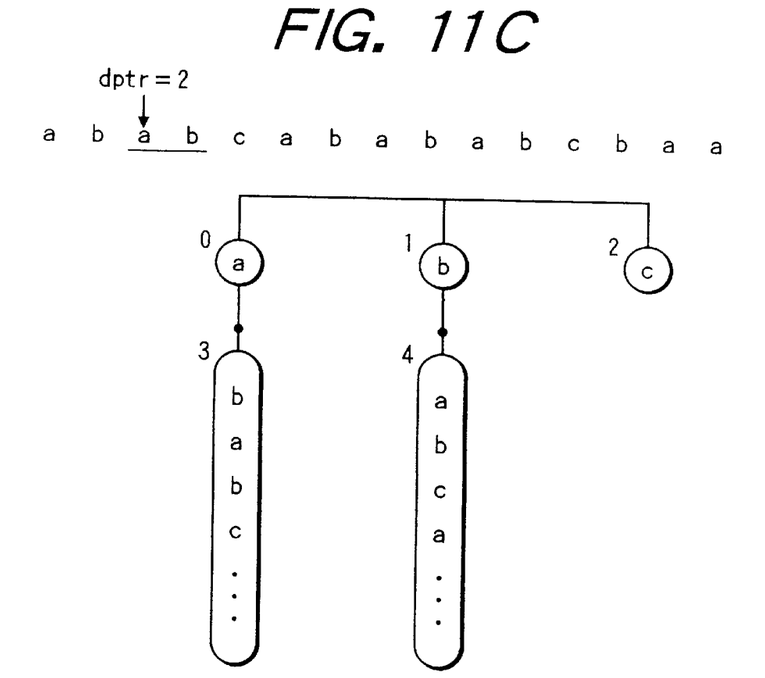

Then, a search for a longest-coincidence character string for an input data character string starting from the character indicated by dptr=1 is again performed, to find a longest-coincidence character string "b". Since the index is "1" and the longest-coincidence character string has a length 1, a set (1, 1) is coded. An entry of index 4 is added to the search tree, and its main node is stored with an infinite-length character string "babc . . . . " The data pointer value dptr is incremented by the number 1 of coded character so as to have a value 2 (dptr=2). FIG. 11C shows a search tree in this state.

Figure 11D:
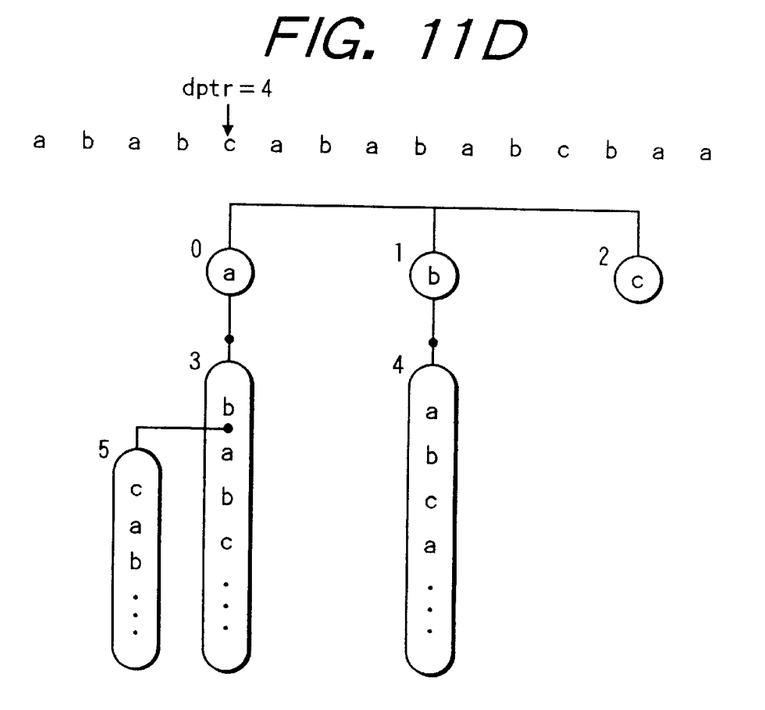

Thereafter, a search for a longest-coincidence character string for an input data character string "abca . . . " starting from the character indicated by dptr=2 is performed. In this case, longest coincidence of a length 2 is found between the above input data character string and the character string "ababc . . . " stored registered in index 3. Therefore, a set (3, 2) is coded. Branching of the search tree occurs between the longest-coincidence character string "ab" and the next character. An entry of index 5 is added to the search tree, a branching node is generated between "ab" and the next character "a", and its main node is stored with an infinite-length character string "abca . . . " starting from the character indicated by dptr=2. The data pointer value dptr is incremented by the number 2 of coded characters so as to have a value 4 (dptr=4). FIG. 11D shows a search tree in this state.

Figure 11E:
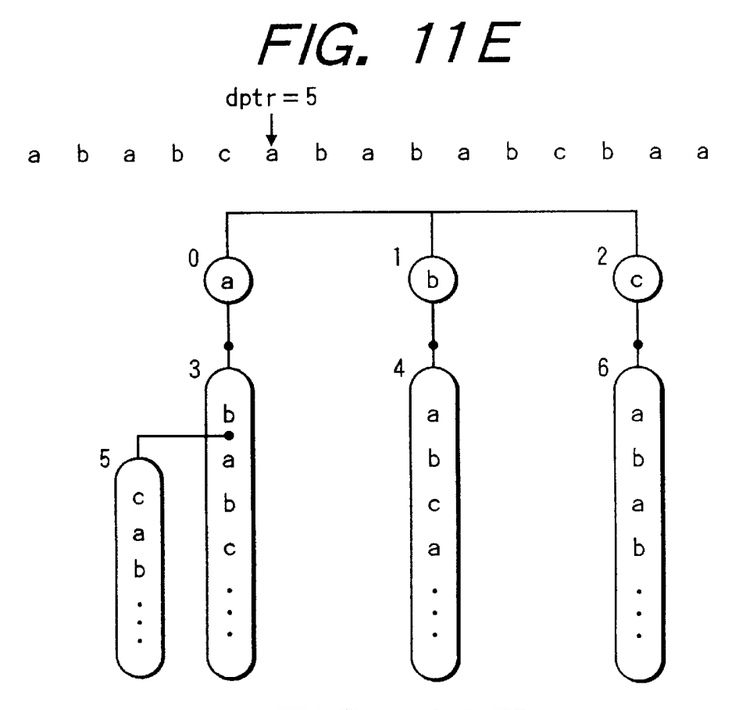
Figure 11F:
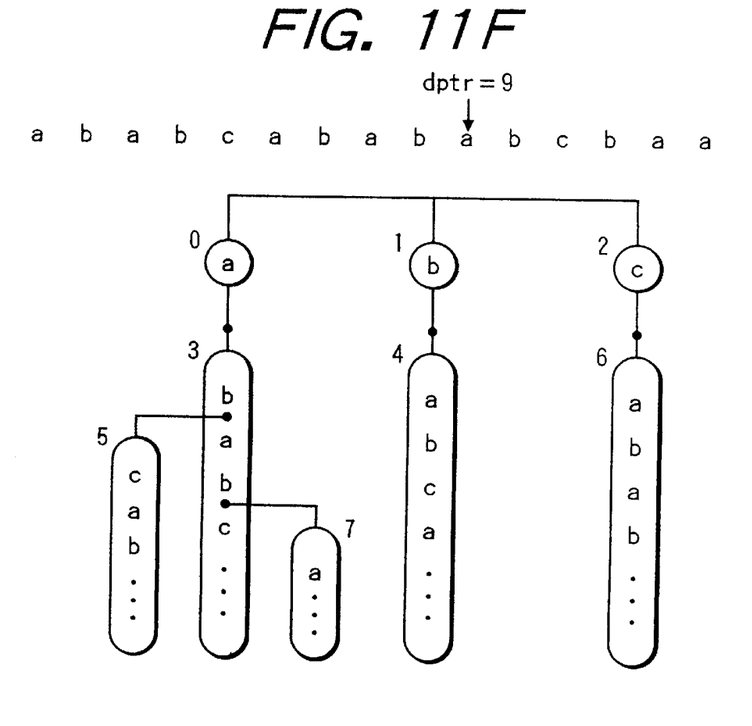

By performing a similar operation, it is found that a longest-coincidence character string for an input data character string starting from the character indicated by dptr=4 is "c", and a set "(2, 1)" is coded. An entry of index 6 is added to the search tree as shown in FIG. 11E. By further performing a similar operation, it is found that a longest-coincidence character string for an input data character string starting from the character indicated by dptr=5 is "abab", and a set "(3, 4)" is coded. An entry of index 7 is added to the search tree as shown in FIG. 11F. As similar operations continue to be performed, the input data is compressed while the search tree grows.

Flow of Compression Process

Figure 4:
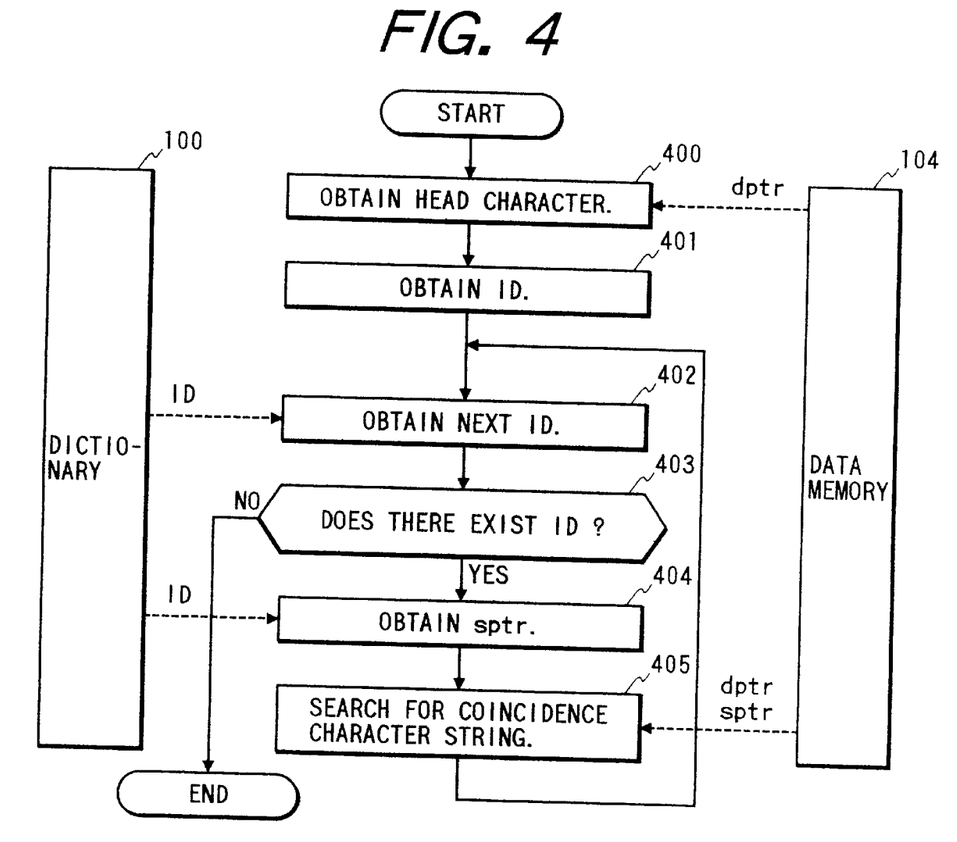
FIG. 4 shows a process executed by a longest-coincidence character string search means.
Figure 5:
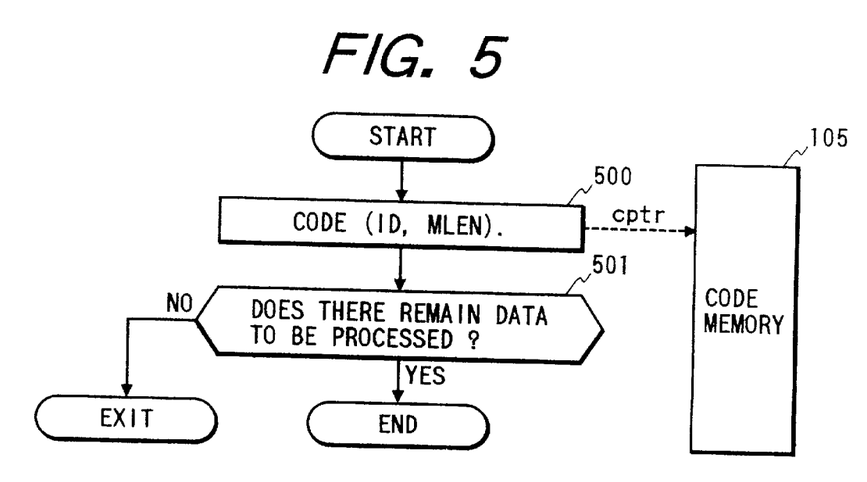
FIG. 5 shows a process executed by a coding means.
Figure 6:
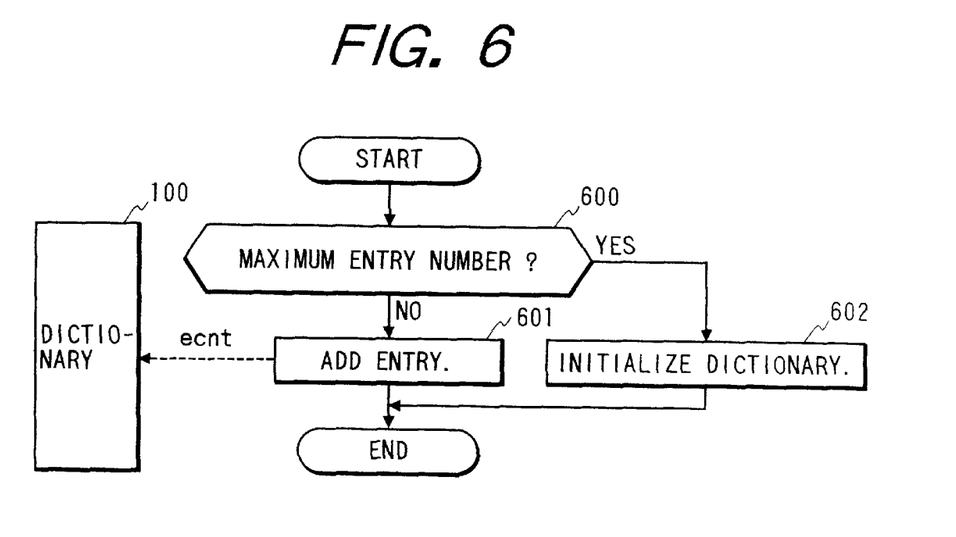
FIG. 6 shows a process executed by a dictionary updating means.

The compression process includes three major processes, which will be described below in detail. In FIGS. 4–6, which are related to this section, a solid-line arrow indicates a process flow and a broken-line arrow indicates a data movement. Symbols written above broken-like arrows denote pointers for referencing data of the dictionary 100, a data memory 104, and a code memory 105. Symbols used are defined as follows:

data pointer dptr: pointer indicating an input data read position in the data memory 104;

search pointer sptr: pointer indicating a character string to be subjected to a search for a coincidence character string;

code pointer cptr: pointer indicating a compressed data write position in the code memory 105;

index ID: index of an entry of the dictionary 100; and entry counter ecnt: number of entries registered in the dictionary 100.

FIG. 4 shows details of a process executed by a longest-coincidence character string search means 101. First, at step 400, the head character of input data to be coded is read from the data memory 104. At step 401, ID of an initial registration node is obtained from the head character. IDs of initial registration nodes of the dictionary 100 are completely in one-to-one correspondence with characters that will appear in the input data. Therefore, if this relationship is preliminarily set as a table, the ID of the initial registration node of the head character can be obtained by inputting the head character. In general, if input data has values of byte data 00-ff, for instance, initial registration nodes of the dictionary 100 may be so constructed as to have IDs that are identical with the values themselves of the input data. In this case, the table conversion step can be omitted.

Once the ID of the initial registration node of the head character has been determined at step 401, the substantive process is started. At step 402, ID of a closest branching node is determined to allow a shift from the node indicated by the current ID to a next node. This is done such that the dictionary 100 is referenced by using the current ID and the ID of the closest branching node is determined from the value of bnd or mnd of an entry indicated by the current ID. At step 403, the ID obtained at step 402 is checked. If it has a value NIL (termination symbol), the process is finished because there are no further character strings for search.

If the ID obtained at step 402 has a value other than NIL, a search for a coincidence character string is performed by using a character string registered in an entry indicated by the ID. At step 404, sptr is obtained by referencing the dictionary 100 based on the ID value. sptr is identical with a pointer ptr of the character string stored in the entry of the dictionary 100 indicated by the ID. At step 405, character strings indicated by sptr and dptr are read from the data memory 104, and compared with each other. The number of characters over which a match has been found by the comparison is made a coincidence length. Upon completion of step 405, the process returns to step 402 to repeat steps 402–405. This loop is continued until a termination symbol NIL appears. A coincidence length finally obtained is employed as a longest-coincidence character string length MLEN.

FIG. 5 shows details of a process executed by a coding means 102. First, at step 500, ID of an entry of the dictionary 100 in which a longest-coincidence character string (that has been determined by the longest-coincidence character string search means 101) is registered and a longest-coincidence character string length MLEN are coded according to a predetermined code format. A code thus obtained by coding, i.e., compression, is written to the code memory 105. At step 501, it is judged whether there remains input data to be processed in the data memory 104. If there remains no input data, the compression process is finished (EXIT). If there remains input data, the coding process is finished and the next process is started.

Figure 13:
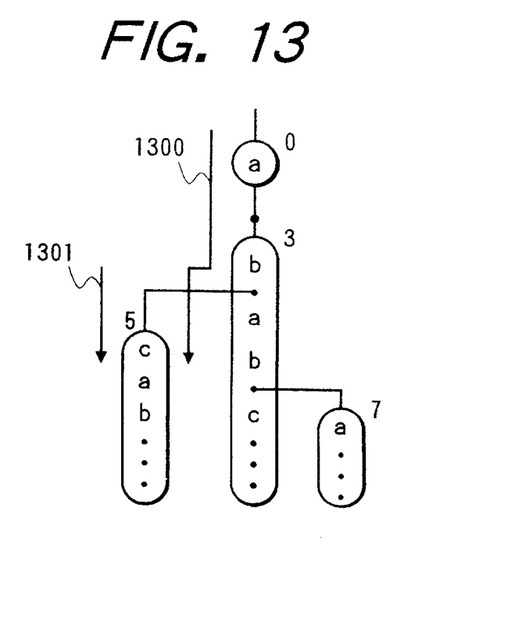
FIG. 13 illustrates two methods of counting a longest-coincidence character string length.

As described above, coding is performed on a set of an index ID and a longest-coincidence character string length MLEN. It should be noted that there are two methods of coding MLEN: counting MLEN from the root of a search tree, and counting it from a branching node. Assume a case of searching for a longest-coincidence character string with the search tree of FIG. 11F. A longest-coincidence character string for an input data character string starting from the character indicated by dptr=9 is "abc", and ID of an entry in which that character string is "5". According to the method of counting a longest-coincidence character string length MLEN from the root, it is 3 as indicated by reference numeral 1300 in FIG. 13; therefore, a code is expressed by a set (5, 3). According to the method of counting MLEN from the branching node of index 5, it is 1 as indicated by reference numeral 1301 in FIG. 13; hence, a code is expressed by a set (5, 1).

As for differences between the two methods, values of coincidence lengths are distributed closer to 0 in the method of counting MLEN from a branching node than in the method of counting it from the root. Therefore, the former method has a smaller entropy, resulting in a high compression ratio. However, in a decompression process described later, the former method needs a larger memory size than the latter method.

FIG. 6 shows details of a process executed by a dictionary updating means 103. First, at step 600, it is judged whether the number of entries of the dictionary 100 has reached a given maximum value (maximum entry number). Like a search tree of the LZ78 scheme, a search tree of the invention is not allowed to infinitely grow, that is, increase in the number of nodes. Therefore, the number of nodes of a search tree (i.e., the number of entries of the dictionary 100) should be restricted in the above manner.

The maximum entry number is determined by a tradeoff between the memory cost and the compression ratio. That is, as the maximum entry number increases, the compression ratio is generally improved because of an increase in the number of character strings for reference, whereas the memory cost is increased because of an increase in the memory size required by, the dictionary 100.

If a judgment result of step 600 indicates that the dictionary 100 still has a space to accommodate a new entry, the process goes to step 601, where values are written to a new entry. Addition of a new entry to the dictionary 100 is equivalent to occurrence of a new branching in a search tree. The dictionary 100 is updated in somewhat different manners depending on branching positions in a search tree. This is because the form of a link to a parent entry depends on whether branching occurs between a main node and a branching node or between two branching nodes.

Figure 12A:
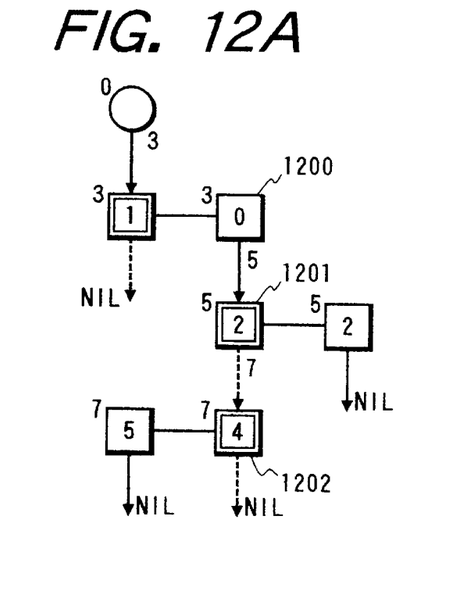
FIGS. 12A–12C illustrate how a new entry is added to a search tree.
Figure 12B:
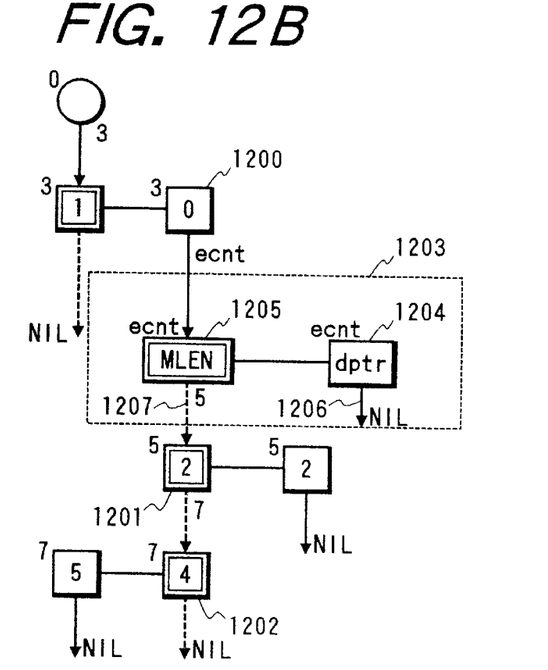

For example, FIG. 12B shows a case where branching occurs between a main node 1200 and a branching node 1201 of a search tree of FIG. 12A and a new entry 1203 is added. The entry 1203 has an index ecnt. The main node 1204 stores a pointer to a character string obtained by connecting a character string of coded input data and an ensuing character string of an infinite length. Since this pointer is pointer dptr to the character string of the coded input data, pointer dptr is written in the main node 1204 of the entry 1203. Since an offset number off to be written in a branching node 1205 is the number of characters to the branching position, it is identical to a longest-coincidence character string length MLEN. A termination symbol NIL is written for a branch 1206 of the entry 1203, because the newly registered main node 1204 includes no branching. An index indicating a link to the next branching node is written for a branch 1207 of the entry 1203. The value of a branch mnd from the main node 1200, which is the parent entry of the entry 1203, is changed to the index value ecnt of the inserted entry 1203.

Figure 12C:
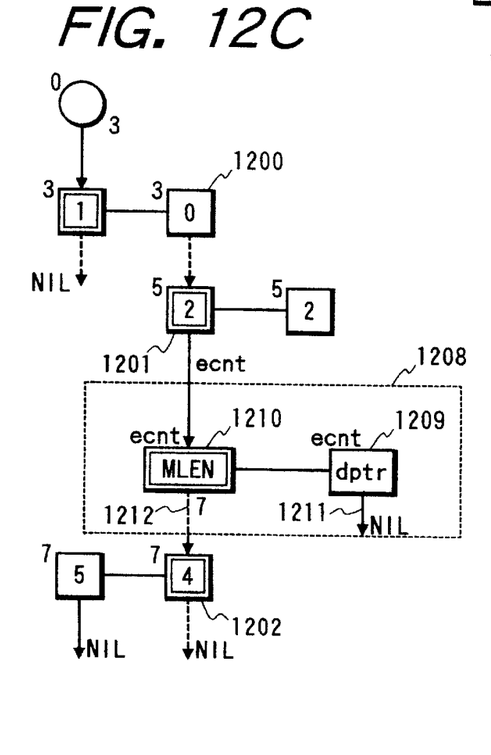

FIG. 12C shows a case where branching occurs between branching nodes 1201 and 1202 of the search tree of FIG. 12A and a new entry 1208 is added. Respective components 1209–1212 of the entry 1208 are generated in the same manner as in the above case where the entry 1203 is added. The cases of FIGS. 12B and 12C are different in that the new entry occurs from the branching node of the parent entry or from its main node. Therefore, while mnd of the parent entry is changed in the case of FIG. 12B, bnd of the parent entry is changed in the case of FIG. 12C.

At step 601, not only is the new entry added to the dictionary 100, but also the values of dptr and ecnt are updated. The value of dptr is increased by the number MLEN of coded characters of the longest-coincidence character string, and the value of ecnt is increased by the number 1 of added entry.

If the number of entries is judged to be equal to the maximum number at step 600, the process goes to step 602, where the dictionary 100 is initialized, that is, all the contents are erased except the initial registration nodes.

Configuration of Conversion Table

Figure 7A:
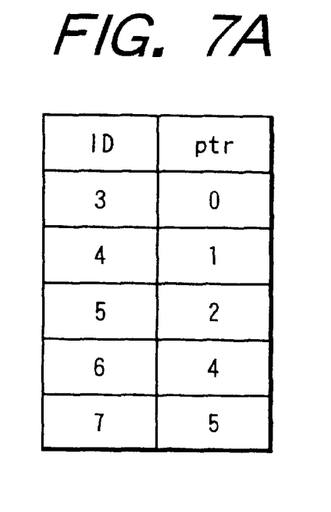
FIGS. 7A and 7B show configurations of two kinds of conversion tables.
Figure 7B:
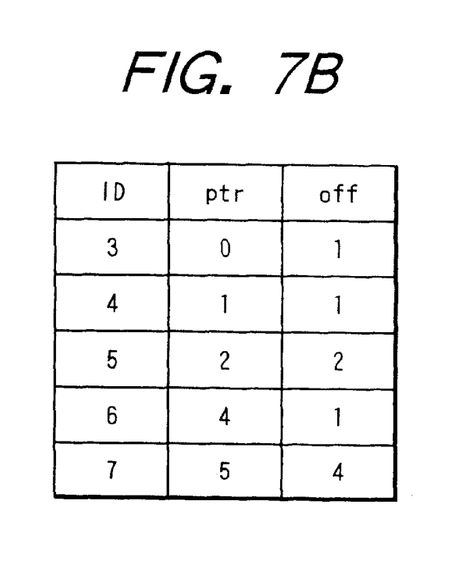

A conversion table 200 has a role of a dictionary in a decompression process. The conversion table 200 is constructed differently depending on how a coincidence length MLEN is coded. FIG. 7A shows a conversion table of a decompression process for the case of counting a coincidence length from the root of a search tree. This table describes correspondence between IDs of respective entries of the dictionary 100 and pointers to respective character strings stored in the data memory 104. FIG. 7B shows a conversion table of a decompression process for the case of counting a coincidence length from a branching node of a search tree. This table describes correspondence between IDs, ptr's, and off's. In the former case, it is sufficient that only the ptr value of a pointer of a copy origination character string be obtained from the conversion table 200, because a coded coincidence length is equal to the number of characters to be copied. In contrast, in the latter case, the value of off is also needed because the number of characters to be copied cannot be obtained unless the number of characters from the root to a branching node is added to a coded coincidence length.

Flow of Decompression Process

Figure 8:
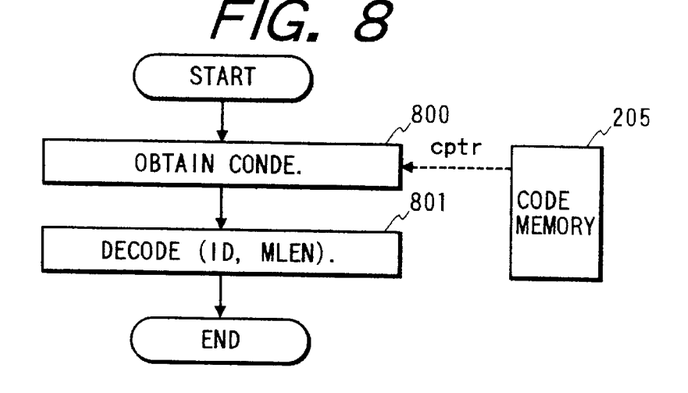
FIG. 8 shows a process executed by a decoding means.
Figure 9:
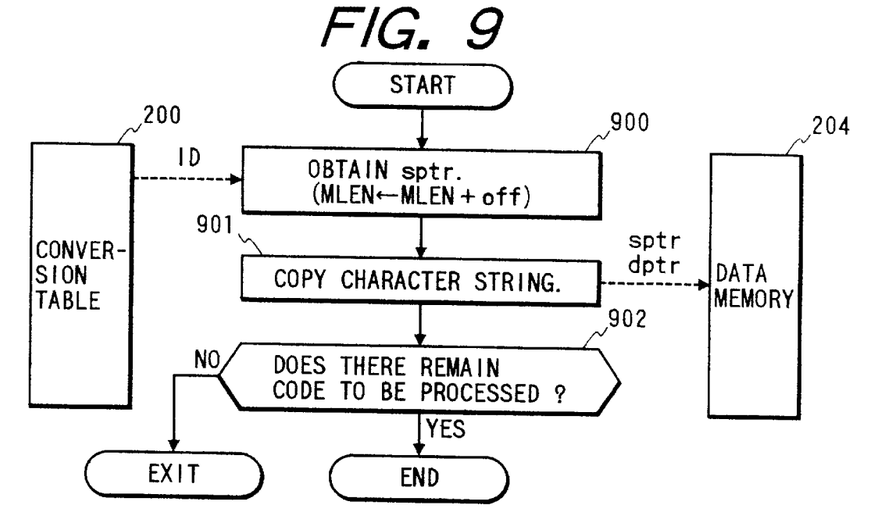
FIG. 9 shows a process executed by a data copying means.
Figure 10:
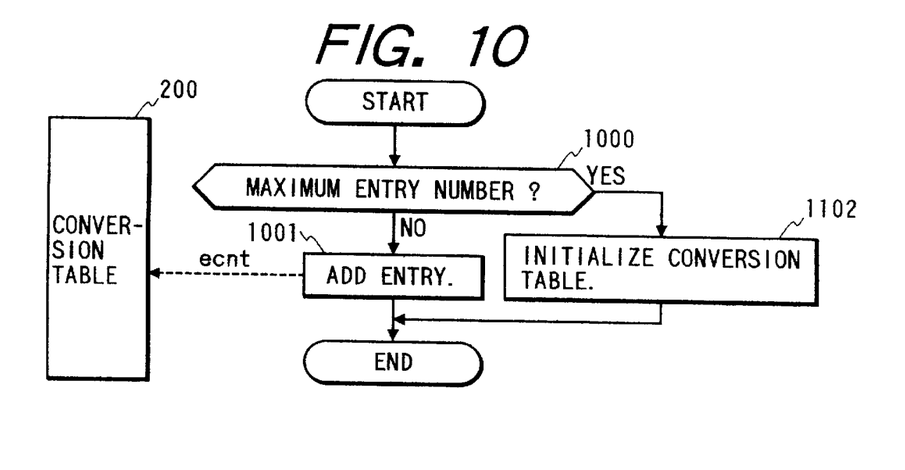
FIG. 10 shows a process executed by a conversion table updating means.

The decompression process includes three major processes, which will be described below in detail. In FIGS. 8–10, which are related to this section, a solid-line arrow indicates a process flow and a broken-line arrow indicates a data movement. Symbols written above broken-like arrows denote pointers for referencing data of the conversion table 200, a data memory 204, and a code memory 205. Symbols used are defined as follows:

data pointer dptr: pointer indicating a restored data write position in the data memory 204;

search pointer sptr: pointer indicating a copy origination character string in character string copying;

code pointer cptr: pointer indicating a compressed data read position in the code memory 205;

index ID: index of an entry of the conversion table 200; and entry counter ecnt: number of entries registered in the conversion table 200.

FIG. 8 shows details of a process executed by a decoding means 201. First, at step 800, a compressed code is obtained by referencing the code memory 205 by using a code pointer cptr. The compressed code is a result of coding by the coding means 102 according to the predetermined code format of a set (ID, MLEN) of an index ID and a coincidence length MLEN. At step 801, ID and MLEN values are uniquely obtained by decoding the compressed code according to the predetermined code format.

FIG. 9 shows details of a process executed by a data copying means 202. At step 900, a copy origination pointer sptr and the number MLEN of copy characters that are necessary for character string copying are determined by referencing the conversion table 200 by using an ID value as obtained by decoding by the decoding means 201. As described above, there are the two methods of counting a coincidence length MLEN: counting it from the root of a search tree and counting it from a branching node. In the former case, the decompression process uses the conversion table of FIG. 7A; therefore, a ptr value is referenced by using ID at step 900. The ptr value thus obtained is used as a pointer sptr for character string copying. A MLEN value is used as it is because it represents the number of copy characters. In the latter case, the decompression process uses the conversion table of FIG. 7B; therefore, ptr and off values are referenced by using ID at step 900. The ptr value is used as a pointer sptr. The number of copy characters is calculated by adding the off value to a MLEN value.

At step 901, an already restored character string in the data memory 204 is copied the position indicated by a data pointer dptr based on the character string copy origination pointer sptr and the number MLEN of copy characters that have been obtained at step 900. Data is decompressed by this character string copying, so that data before being subjected to the compression is recovered. At step 902, it is judged whether there remains a compressed code to be processed in the code memory 205. If there remains no compressed code, the decompression process is finished (EXIT). If there remains a compressed code, the next process is started.

FIG. 10 shows details of a process executed by a conversion table updating means 203. At step 1000, it is judged whether the number of entries registered in the conversion table 200 has reached a maximum entry number, which is set the same as that for the dictionary 100 used in the compression process.

If a judgment result of step 1000 indicates that the conversion table 200 still has a space to accommodate a new entry, the process goes to step 1001, where values are written to a new entry. In the case of the conversion table of FIG. 7A, for an entry having an index value ecnt, a copy destination pointer dptr indicating a position where a character string has been written by the data copying means 202 is written to the column of ptr of the conversion table. In the case of the conversion table of FIG. 7B, the number MLEN of copy characters is written to the column of off in addition to the above value.

At step 1001, not only is the new entry added to the conversion table 200, but also the values of dptr and ecnt are updated. The value of dptr is increased by the number MLEN of decompressed characters, and the value of ecnt is increased by the number 1 of added entry.

If the number of entries is judged to be equal to the maximum number at step 1000, the process goes to step 1002, where the conversion table 200 is initialized, that is, completely erased.

With the above updating process, the dictionary 100 in the compression process and the conversion table 200 in the decompression process are rendered completely compatible: character strings stored in respective entries of the dictionary 100 are identical to those stored in respective entries of the conversion table 200.

As described above, according to the data compression scheme of the present invention, each entry of the dictionary stores a character string of an infinite length. Therefore, the compression scheme is free of the limitation of finiteness of registered character string lengths as in the LZ78 scheme.

Therefore, the data compression scheme of the invention can efficiently compress input data, such as binary image data, having a data structure in which a long data pattern is repeated at high frequency.

In the dictionary updating process and the conversion table updating process, only one entry is updated at each time. Therefore, the compression and decompression processes can be performed at higher speed than those of the LZ77 scheme, which requires updating of a plurality of entries at each time.

In the coding process, by expressing a coincidence length by the number of characters counted from a branching node, values of coincidence lengths are distributed close to 0. Therefore, coincidence lengths have a small entropy, providing high coding efficiency.

According to the data decompression scheme of the invention of the invention, data can be restored merely by designating a pointer to a copy origination character string in the data memory and the number of copy characters, and copying the designated character string in the data memory to a write position in the data memory. Therefore, the data decompression can be performed at high speed.

What is claimed is:

1. A data compressing apparatus comprising:

a data memory for storing input data;

a code memory for storing codes obtained by compressing the input data;

a dictionary having a plurality of entries each for storing a first pointer that indicates a character string of the input data stored in the data memory, the dictionary being expressed by a search tree including a main node for storing the first pointer, and a branching node for representing branching in the search tree, longest-coincidence character string search means for searching for a longest-coincidence character string that coincides with a character string to be coded over a longest length from among the character strings indicated by the respective first pointers, the longest length being a longest-coincidence length;

coding means for coding the longest-coincidence length and an index of an entry storing a first pointer indicating the longest-coincidence character string, and for writing a resulting code to the code memory; and dictionary updating means for adding to the dictionary an entry storing the first pointer indicating the coded character string, wherein the dictionary allows registration of the entries with no limitation on lengths thereof by storing the first pointers in the respective entries, whereby a character string having an arbitrary length stored in the data memory can be found and coded by designating an index of an entry and the longest-coincidence length.

2. The data compressing apparatus according to claim 1, wherein each of the entries of the dictionary comprises:

the first pointer;

a number of characters existing on a path from a root of the search tree to a branching position, the number being an offset number;

a second pointer for representing a link to a first-occurring branching node in the main node; and a third pointer for representing a link from a branching node to a next branching node.

3. The data compressing apparatus according to claim 1, wherein the search tree further comprises initial registration nodes for storing, preliminarily and respectively, all of characters appearing in the input data, and each of the initial registration nodes has an index that is equal to a value of a character stored in the initial registration node.

4. The data compressing apparatus according to claim 1, wherein the coding means expresses, in coding the longest-coincidence length, the longest-coincidence length by using a length that is counted from a branching node that is closest to an end character of the longest-coincidence character string on a side closer to the root of the search tree.

5. The data compressing apparatus according to claim 1, wherein the coding means expresses, in coding the longest-coincidence length, the longest-coincidence length by using a length that is counted from a root of the search tree.

6. A data decompressing apparatus comprising:

a code memory for storing compressed codes;

a data memory for storing data obtained by decompressing the compressed codes;

a conversion table having entries each correlating an index with a pointer indicating a restored character string stored in the data memory;

decoding means for decoding a code stored in the code memory into an index and a longest-coincidence length;

data copying means for copying a restored character string stored in the data memory which is determined based on the longest-coincidence length and a pointer that has been obtained by referencing the conversion table by using the decoded index, to the data memory at a restored data writing position; and conversion table updating means for adding, to the conversion table, an entry correlating a non-registered index with the pointer indicating the copied character string stored in the data memory.

7. The data decompressing apparatus according to claim 6, wherein each of the entries of the conversion table correlates an index, a pointer indicating a restored character string stored in the data memory, and a number of characters of the restored character string as counted from a branching node that is closest to an end character of the restored character string on a side closer to a root of a search tree.

* * * * *